United States Patent
Tower et al.

(10) Patent No.: US 7,265,397 B1
(45) Date of Patent: Sep. 4, 2007

(54) CCD IMAGER CONSTRUCTED WITH CMOS FABRICATION TECHNIQUES AND BACK ILLUMINATED IMAGER WITH IMPROVED LIGHT CAPTURE

(75) Inventors: John Robertson Tower, Yardley, PA (US); Peter Alan Levine, West Windsor, NJ (US); Pradyumna Kumar Swain, Franklin Park, NJ (US); Nathaniel Joseph McCaffrey, Rosemont, NJ (US); Taner Dosluoglu, New York, NY (US)

(73) Assignee: Sarnoff Corporation, Princeton, NJ (US)

( * ) Notice: Subject to any disclaimer, the term of this patent is extended or adjusted under 35 U.S.C. 154(b) by 176 days.

(21) Appl. No.: 09/942,835

(22) Filed: Aug. 30, 2001

Related U.S. Application Data

(60) Provisional application No. 60/228,972, filed on Aug. 30, 2000, provisional application No. 60/267,002, filed on Feb. 7, 2001, provisional application No. 60/266,935, filed on Feb. 7, 2001.

(51) Int. Cl.
*H01L 27/148* (2006.01)
*H01L 29/768* (2006.01)

(52) U.S. Cl. .............. 257/223; 257/246; 257/247; 257/248; 257/249

(58) Field of Classification Search ............. 257/223, 257/230, 246–249; 438/60, 75
See application file for complete search history.

(56) References Cited

U.S. PATENT DOCUMENTS

| | | | |
|---|---|---|---|
| 3,953,733 A | 4/1976 | Levine | |
| 4,229,752 A | 10/1980 | Hynecek | |
| 4,608,606 A | 8/1986 | Levine | |
| 4,649,407 A * | 3/1987 | Kitamura et al. | ............ 257/217 |
| 4,660,090 A * | 4/1987 | Hynecek | ............ 348/311 |
| 4,668,971 A | 5/1987 | Hynecek | |

(Continued)

FOREIGN PATENT DOCUMENTS

JP 58124271 * 8/1983 ............. 257/221

(Continued)

OTHER PUBLICATIONS

W. F. Keenan et al.; "A Channel-Stop-Defined Barrier and Drain Antiblooming Structure for Virtual Phase CCD Image Sensors"; IEEE Transactions on Electron Devices; vol. 36, No. 9; Sep. 1989.

(Continued)

*Primary Examiner*—Sara Crane
*Assistant Examiner*—Samuel A. Gebremariam
(74) *Attorney, Agent, or Firm*—Lowenstein Sandler PC

(57) ABSTRACT

An optical sensor circuit for generating signals corresponding to received photoelectrons is formed on a single monolithic substrate and includes a charge coupled device (CCD) array. The array is formed of a plurality of pixels constructed by a standard CMOS process. Each pixel is formed of at least one charge well of minority carriers and a gate oxide layer overlaying the at least one charge well. At least two spaced gate electrodes corresponding in position to the at least two charge wells overlays the gate oxide layer. The space between adjacent electrodes defines a gap to transfer charge between adjacent ones of at the least two spaced gate electrodes and the gap is stabilized. A back-illuminated imager is also described in which photocarriers are diverted from devices integrated with the pixel by a PN junction formed in the pixel structure.

17 Claims, 8 Drawing Sheets

U.S. PATENT DOCUMENTS

| | | | | |
|---|---|---|---|---|
| 4,875,084 | A | * | 10/1989 | Tohyama .................... 257/436 |
| 4,907,049 | A | * | 3/1990 | Slotboom et al. ........... 257/249 |
| 4,952,523 | A | * | 8/1990 | Fujii ........................... 438/75 |
| 4,995,061 | A | * | 2/1991 | Hynecek ...................... 377/58 |
| 5,151,380 | A | | 9/1992 | Hynecek |
| 5,210,433 | A | * | 5/1993 | Ohsawa et al. ............. 257/250 |
| 5,402,459 | A | * | 3/1995 | Hynecek ...................... 377/58 |
| 5,453,632 | A | | 9/1995 | Hynecek et al. |
| 5,591,996 | A | | 1/1997 | Haigh et al. |
| 5,614,740 | A | * | 3/1997 | Gardner et al. ............. 257/222 |
| 5,742,047 | A | | 4/1998 | Buhler et al. |
| 5,808,329 | A | | 9/1998 | Jack et al. |
| 5,841,159 | A | | 11/1998 | Lee et al. |
| 5,881,184 | A | | 3/1999 | Guidash |
| 5,909,244 | A | * | 6/1999 | Waxman et al. ......... 348/222.1 |
| 5,981,932 | A | | 11/1999 | Guerrieri et al. |
| 6,069,376 | A | | 5/2000 | Merrill |
| 6,088,057 | A | * | 7/2000 | Hieda ......................... 348/243 |
| 6,141,050 | A | | 10/2000 | Ackland et al. |
| 6,196,932 | B1 | * | 3/2001 | Marsh et al. ............... 473/223 |
| 6,465,820 | B1 | * | 10/2002 | Fox ............................ 257/223 |
| 6,489,992 | B2 | * | 12/2002 | Savoye ....................... 348/340 |

OTHER PUBLICATIONS

Y. Matsunaga et al.; "A Highly Sensitive On-Chip Charge Detector for CCD Area Image Sensor"; IEEE Journal of Solid-State Circuits, vol. 26, No. 4, Apr. 1991.

S. Ohsawa et al.; "Analysis of Low Signal Level Characteristics for High-Sensitivity CCD Charge Detector"; IEEE Transactions on Electron Devices, vol. 39, No. 6, Jun. 1992.

Y. Matsunaga et al.; "Ultra High Sensitivity On-Chip Amplifier for VLSI CCD Image Sensor"; ULSI Research Center; 1990 Symposium on VLSI Circuits.

E. Roks et al.; "The Double-Sided Floating-Surface Detector: An Enhanced Charge-Detection Architecture For CCD Image Sensors"; IEEE Transactions on Electron Devices, vol. 43, No. 9, Sep. 1996.

B. C. Burkey et al.; "The Pinned Photodiode for an Interline-Transfer CCD Image Sensor"; Research Laboratories, Eastman Kodak Company; Dec. 1984; pp. 28-31.

E. Meisenzahl et al.; "Charge-Coupled Device Image Sensors"; Jan. 1998; http://www.sensormag.com/articles/0198/cc0198/main.shtml.

"An Introduction to Scientific Imaging Charge-Coupled Devices, SITe CCD Technology for Superior Performance"; Scientific Imaging Technologies, Inc.; 1994.

* cited by examiner

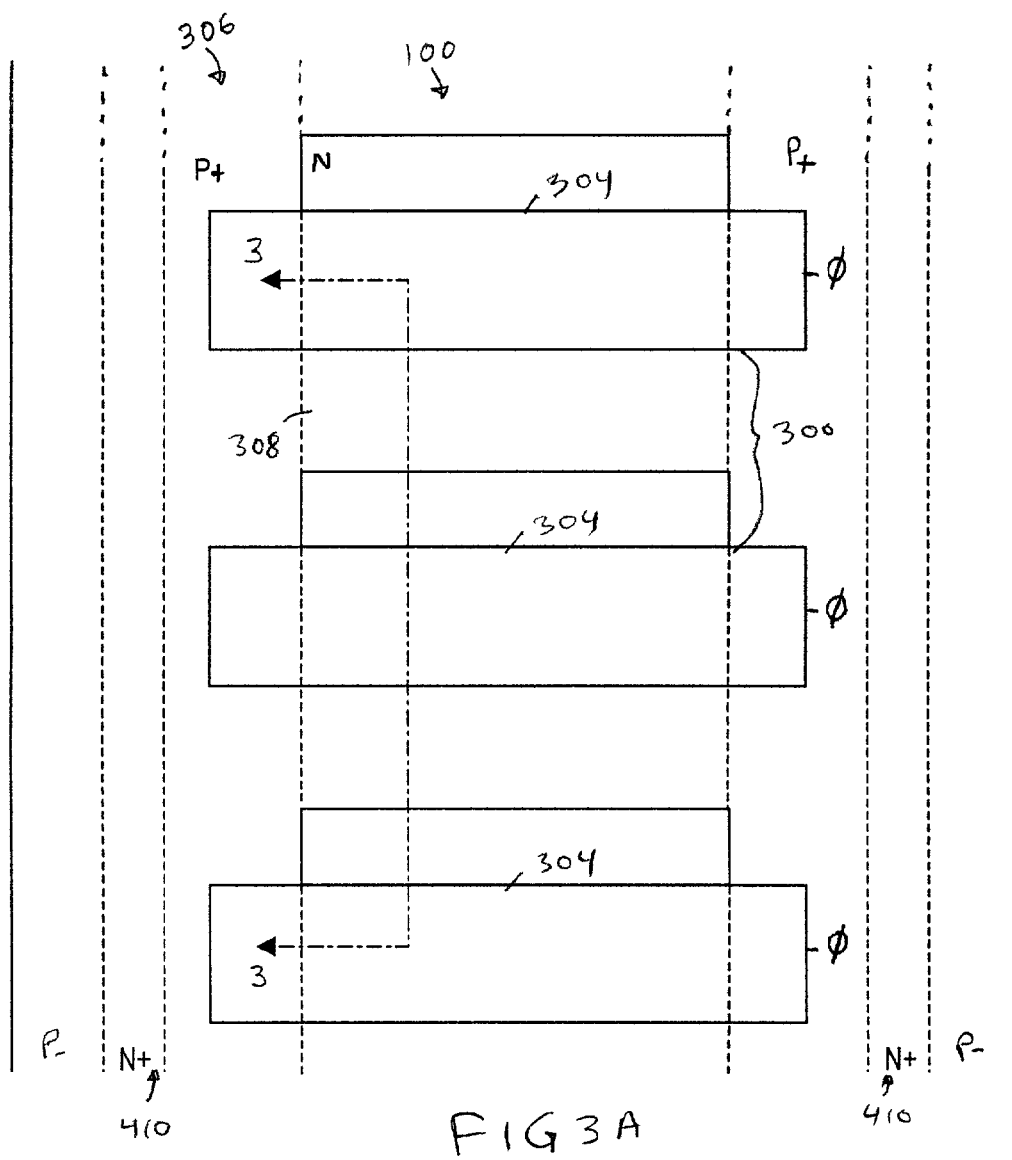
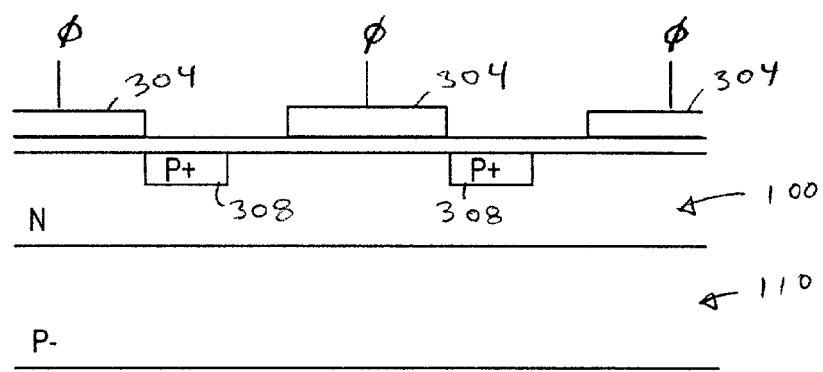
FIG 3A
FIG 3B

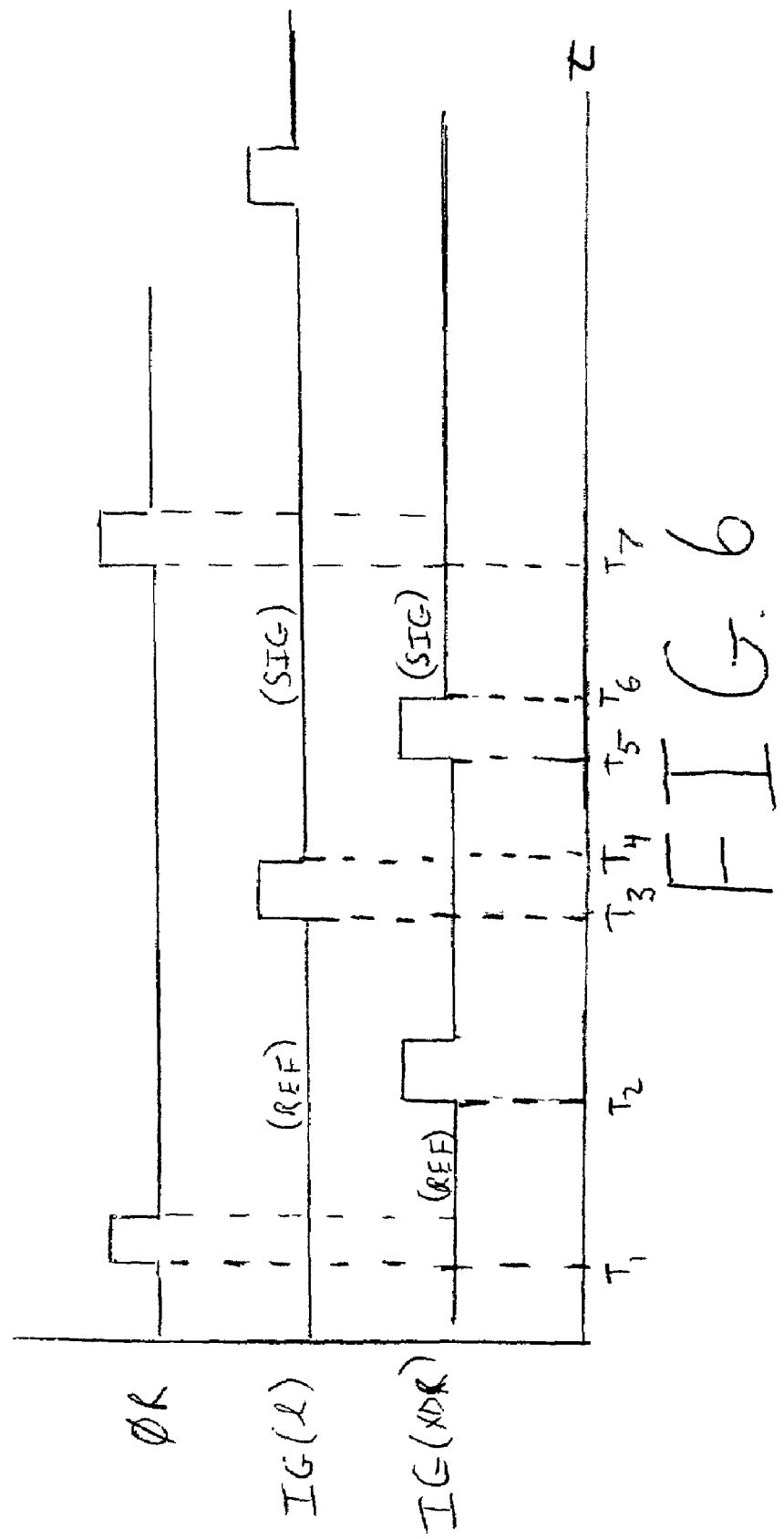

CCD IMAGER CONSTRUCTED WITH CMOS FABRICATION TECHNIQUES AND BACK ILLUMINATED IMAGER WITH IMPROVED LIGHT CAPTURE

CROSS-REFERENCE TO RELATED APPLICATIONS

This application claims the benefit of U.S. Provisional Applications 60/228,972 filed Aug. 30, 2000, 60/267,002; filed Feb. 7, 2001 and 60/266,935 filed Feb. 7, 2001, the entirety of which are incorporated herein by reference.

BACKGROUND OF THE INVENTION

This invention relates to semiconductor circuit design for optical sensors and CCD sensor arrays. More specifically, the invention relates to a CCD device constructed with standard CMOS fabrication techniques and to a back illuminated imager that captures substantially all photoelectrons.

Various types of imagers (also sometimes referred to as image sensors) are in use today, including charge-coupled device (CCD) imagers and complementary metal-oxide semiconductor (CMOS) imagers. These devices are typically incorporated into CCD and CMOS imaging systems, respectively. Such imaging systems comprise an array of pixels, each of which contains a light-sensitive sensor element such as a CCD photogate or virtual photogate detector or, in CMOS imagers, a semiconductor substrate photodiode. Such light-sensitive sensor elements will be referred to herein, generally, as photodetectors.

The CCD photodetectors may be N-channel photogates that collect photoelectrons (i.e. electrons moved to a higher quantum state by interaction with photons) or P-channel photogates that collect photoholes (i.e. the positive charges left behind by the photoelectrons). As used herein, the term photocarriers refers generically to photoelectrons collected by an N-channel device or photoholes collected by a P-channel device.

CMOS imagers typically utilize an array of photodiodes as active pixel sensors and a row (register) of correlated double-sampling (CDS) circuits to sample and hold the output signal of a given row of pixel imagers of the array while removing the kTC noise component. Each active pixel typically contains a pixel amplifying device (usually a source follower transistor). The term active pixel sensor (APS) refers to electronic image sensors employing active devices, such as transistors, that are located within each pixel. CMOS imagers are often interchangeably referred to as CMOS APS imagers or as CMOS active pixel imagers. The active pixel sensors and accompanying circuitry for each pixel of the array will be referred to herein as APS circuits or APS pixel circuits.

In both CMOS and CCD imager systems, each photodetector accumulates charge and hence potential during the optical integration period in accordance with the light intensity reaching the relevant sensing area of the photodetector. As charge accumulates, the photodetector begins to "fill" or approach a saturation state. The charge stored in a photodetector is sometimes said to be stored in the "charge well" of CCD-type photodetectors located underneath an electrode overlying the semiconductor substrate. If the photodetector becomes full of charge or saturated prior to read-out, then excess charge is shunted off to a "blooming drain," in part to prevent blooming. Blooming is a phenomenon in which excess charge beyond pixel saturation spills over into adjacent pixels, causing blurring and related image artifacts.

CMOS imagers have several advantages over CCD imagers such as reduced power consumption and miniaturization. CCD imagers typically use three different input voltages with separate, relatively high voltage power supplies to drive them. In addition, CCD arrays typically employ multiple overlapping gate electrodes in each pixel cell and the gates receive two or three respectively different clock phases. These gates are not feasible to form with standard CMOS processes. As can be appreciated, traditionally, it has not been easy to integrate CCD imagers with CMOS process peripheral circuitry due to complex fabrication requirements and relatively high cost of the specialized fabrication plant needed to produce such devices. By contrast, because CMOS imagers are formed with the same CMOS process technology as the peripheral circuitry used to operate the CMOS imager, such sensors are easier to integrate into a single system-on-chip using integrated circuit (IC) fabrication processes. By using CMOS imagers, it is possible to have monolithic integration of control logic and timing, image processing, and signal-processing circuitry such as analog-to-digital (A/D) conversion, all within a single sensor chip. Thus, CMOS cameras can be manufactured at low cost, relative to CCD cameras, because the imager, the peripheral circuitry and the signal processing circuitry all can be made using a standard CMOS IC fabrication processes.

In addition, CMOS devices use only a single power supply, which may also be used to drive peripheral circuitry. This gives CMOS imagers an advantage in terms of external circuitry complexity, and also in terms of the amount of chip area or "real-estate" devoted to power supplies. In this way, CMOS imagers have relatively low power requirements because of the relatively low voltage power supply required for operation, and also because only one row of pixels in the APS array needs to be active during readout.

Despite these advantages, however, CMOS imagers also have various disadvantages in comparison to CCD imagers. For example, CMOS optical sensor circuits are subject to reset noise, often referred to as "kTC noise." reset noise is due to the on-resistance of the MOS transistor and is injected each time the transistor is reset. CMOS image sensors have two sources of reset noise: in the pixel and in the column processing circuitry. Reset noise is described in an article, entitled "Two-Phase Charge-Coupled Devices with Overlapping Polysilicon and Aluminum Gates" by W. F. Kosonocky and J. E. Carnes, in *RCA Review*, Vol. 34, March 1973, pp. 164-203. Reset noise is considered to be a type of thermal noise. The kTC noise magnitude is related to k, the Boltzmann constant, T, the temperature in Kelvin, and C, the capacitance in the current path. Technically, the magnitude of the noise is proportional to the square root of the product of the Boltzmann constant, the temperature in Kelvin, and the capacitance in the pixel's current path. The local temperature variations in each pixel give rise to this random noise. Immediately after the reset operation, the pixel may have a non-zero signal value, equal to the kTC noise. Many CMOS imagers employ correlated double sampling (CDS) circuits to cancel this noise from the imager output. CDS circuits operate by sampling the noise value immediately after reset and subtracting the noise from the pixel value at the end of the integration period. CCD imagers may be reset without significant noise by simply transferring any charge in the imager cell to a charge dump using the normal CCD charge transfer techniques. Because it may occur on a pixel-by-pixel basis, some imager arrays need a frame store memory to effectively reduce reset noise.

It would be desirable to provide an image sensor which addresses known disadvantages of CMOS imagers, by employing CCD imaging technology in a single semiconductor device manufactured using a standard CMOS fabrication process.

SUMMARY OF THE INVENTION

The present invention is embodied in a charge coupled device made according to standard CMOS process. The charge coupled device includes at least two charge well areas, a dielectric layer overlaying the at least two charge well areas, and at least two gate electrodes overlaying the dielectric layer. The at least two gate electrodes correspond in position to the at least two charge wells. The at least two gate electrodes are separated by a stabilized inter-electrode gap.

According to one aspect of the invention, the inter-electrode gaps are stabilized by forming a second oxide layer over the conductive gate electrodes and then forming conductive elements over the gaps between the gate electrodes. These conductive elements may be metal electrodes in a single polysilicon CMOS process or polysilicon electrodes in a double polysilicon CMOS.

In another aspect, the invention is an electronic camera formed on a monolithic integrated circuit that includes a CCD imaging array and a CMOS analog-to-digital converter capable of producing a digital output signal corresponding to the image captured by the CCD array.

In yet another aspect, the invention is embodied in a back-illuminated imager in which the pixel circuitry is shielded from photocarriers by PN junctions that direct any captured photocarriers into the closest photodetector.

BRIEF DESCRIPTION OF THE DRAWINGS

FIG. 3A is a top plan view of a physical layout of a portion of a virtual gate CCD array according to the present invention.

FIG. 3B is a cross-sectional view along lines 3-3 of the CCD array shown in FIG. 3A.

FIG. 6 is a timing diagram, showing the temporal relation of the signals of FIG. 5;

DETAILED DESCRIPTION OF THE EXEMPLARY EMBODIMENTS

Figure 1:
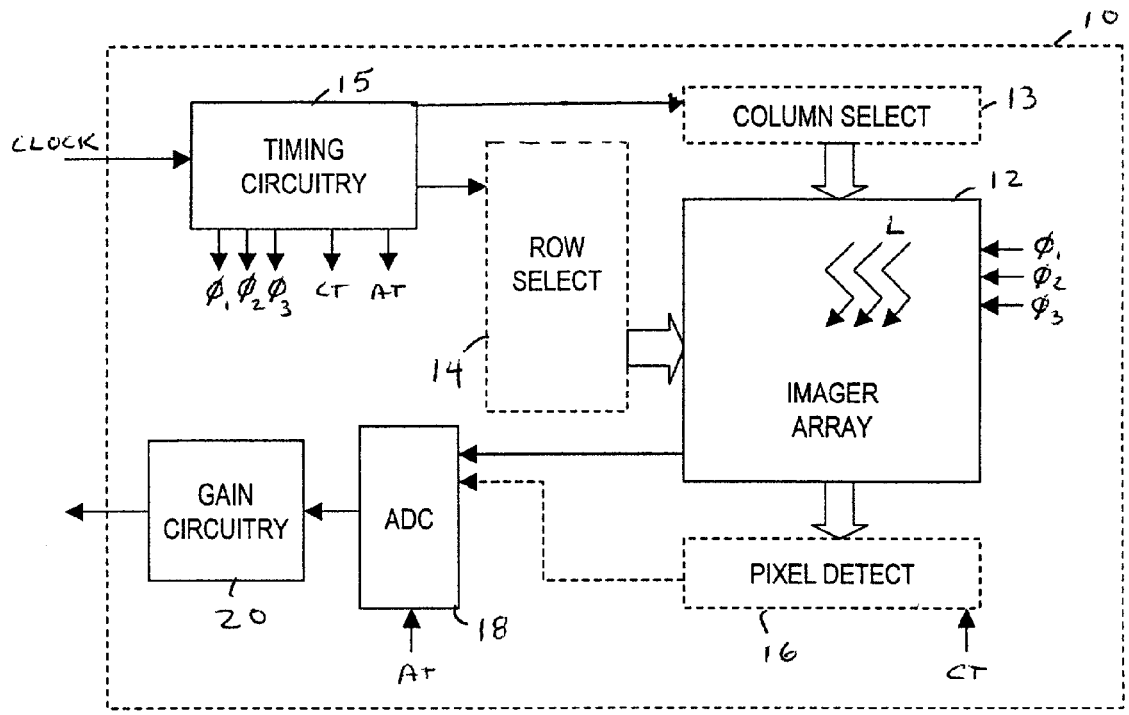
FIG. 1 is high level block diagram of an imager in accordance with an exemplary embodiment of the present invention.

The invention is described in terms of exemplary embodiments which are illustrated in the drawing figures. The drawing figures are not to scale. Indeed, dimensions of the drawing figures are exaggerated to aid in the description of the invention.

Certain terminology used in the following description is for convenience only and is not limiting. The term "standard CMOS IC fabrication processes", is used to describe processes which are compatible with standard CMOS IC fabrication processes, that is to say, processes using fabrication steps that are commonly used in CMOS IC fabrication facilities including optional process steps such as threshold adjusting diffusions. In such processes, devices which are easily fabricated with CMOS IC fabrication processes can be formed on a substrate or semiconductor "wafer" along with the desired imaging devices in accordance with the present invention. In the drawings, the same reference numerals are used for designating the same elements throughout the several figures.

The present invention relates to a CMOS image sensor employing a CCD pixel design/process. The resultant CMOS CCD image sensor is applicable to high-performance visible light imaging, electron-bombardable target (image intensified) imaging, and fiber optic coupled image intensified imaging. The present invention also concerns a camera system employing such an image sensor and to a back-illuminated image sensor in which pixel circuitry is shielded by a PN junction.

System-on-a-Chip (SOC)

Referring now more specifically to the drawings, FIG. 1 is a high-level block diagram of an imager circuit 10 constructed in accordance with an exemplary embodiment of the present invention. The system-on-a-chip (SOC) 10 is formed as a single semiconductor integrated circuit using a single standard CMOS process. The exemplary SOC 10 includes a CCD imager array 12, timing circuitry 15, optional row select circuitry 14, optional column select circuitry 13 and optional column reading circuitry 16, an analog-to-digital converter (ADC) 18 and digital gain circuitry 20.

The row select circuitry 14, column select circuitry 13 and column reading circuitry 16 are all shown as being optional because the CCD imager array 12 may take several different forms. It may be, for example, a conventional field transfer CCD imager array such as is disclosed in U.S. Pat. No. 4,608,606, entitled CCD FLOATING-ELEMENT OUTPUT STAGES PROVIDING LOW RESET NOISE WITH SINGLE SAMPLING. Alternatively, it may be a CMOS-type imager in which rows of pixels are selected and gated onto a plurality of column busses into the column reading circuitry 16 using the row-select circuitry 14 or it may be a CMOS-type imager in which individual pixels are selected one at a time using both the row select circuitry 14 and the column select circuitry 13. For each of these imagers, the individual pixels are sensed using a CCD photogate, as described below with reference to FIGS. 2A through 4D. The CCD photogates and CCD charge transfer circuitry are formed using the process steps of a standard CMOS process, allowing other CMOS circuitry to be implemented on the same integrated circuit as the imager.

For example, all of the circuitry shown in FIG. 1, including the CCD array 12 is formed using standard CMOS IC fabrication processes such as those specifically described herein or processes which are compatible with standard CMOS IC fabrication processes known to those skilled in the art. The ADC 18, which is made at the same time as the CCD imager and using the same CMOS process, may be, for example, a successive approximation ADC such as described in U.S. Pat. No. 5,262,779 entitled ANALOG TO DIGITAL CONVERTER, which is incorporated herein for its teaching on CMOS analog-to-digital converters.

As known to those skilled in the art, the SOC 10 provides an output signal, designated "OUT", proportional to a light signal, designated as "L", impinging the CCD array 12. The CCD array 12 includes a light sensitive area defined by a plurality of rows and columns of imaging pixels. The pixels are read in accordance with a two or three phase clock signal (Ø1, Ø2 and Ø3), generated by the timing circuitry from the externally provided clock signal, CLOCK. The imager array 12 or the pixel detect circuitry 16, depending on the configuration of the imager array 12 provides an analog output signal representing the individual image pixels sequentially scanned as in a conventional video signal. This signal is digitized by the ADC 18 which provides the digitized signal to the digital gain circuitry 20. The circuitry 20 provides the output signal, OUT, of the SOC 10.

Those skilled in the art will recognize that the block diagram of FIG. 1 is given merely as an example. The use of specific signal processing circuits for receiving the output from the ADC 18 would depend upon the specific application to which the SOC 10 is used. Examples of variations include scan control circuitry for adjusting scan between interlaced and non-interlaced scans and control circuits for extending or reducing image sampling periods to adjust the operation of the imager for various light levels. The use of a CMOS process is particularly advantageous because this permits the use of the large library of CMOS circuits that already exist. Thus, the CMOS process further increases the fabrication yield of the CCD imager arrays of the exemplary embodiment because it is possible to configure related on-chip circuitry in a manner which facilitates high yield. Because of its size, the limitations on the yield of the design results primarily by the CCD imager array 12 itself. Similarly, the ability to fabricate complex CMOS circuitry as the CCD imager array 12 increases reliability of the end product because interconnections between the CCD array circuitry and further circuitry are included in the system-on-a-chip (SOC).

Figure 1A:
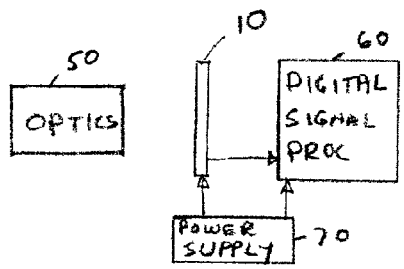
FIG. 1A is a block diagram of an electronic camera that may be made using the imager shown in FIG. 1.

FIG. 1A is a block diagram of an electronic camera system that may be implemented using the SOC 10 shown in FIG. 1. The exemplary camera system includes the SOC 10, an optics section that focuses radiation onto the imager array 12 of the SOC 10, a digital signal processor (DSP) 60 that processes the digitized video signals provided by the SOC 10 and a power supply 70 that provides operational power to the SOC 10 and the DSP 60.

Physical Layout of the CCD Array

Figure 2A:
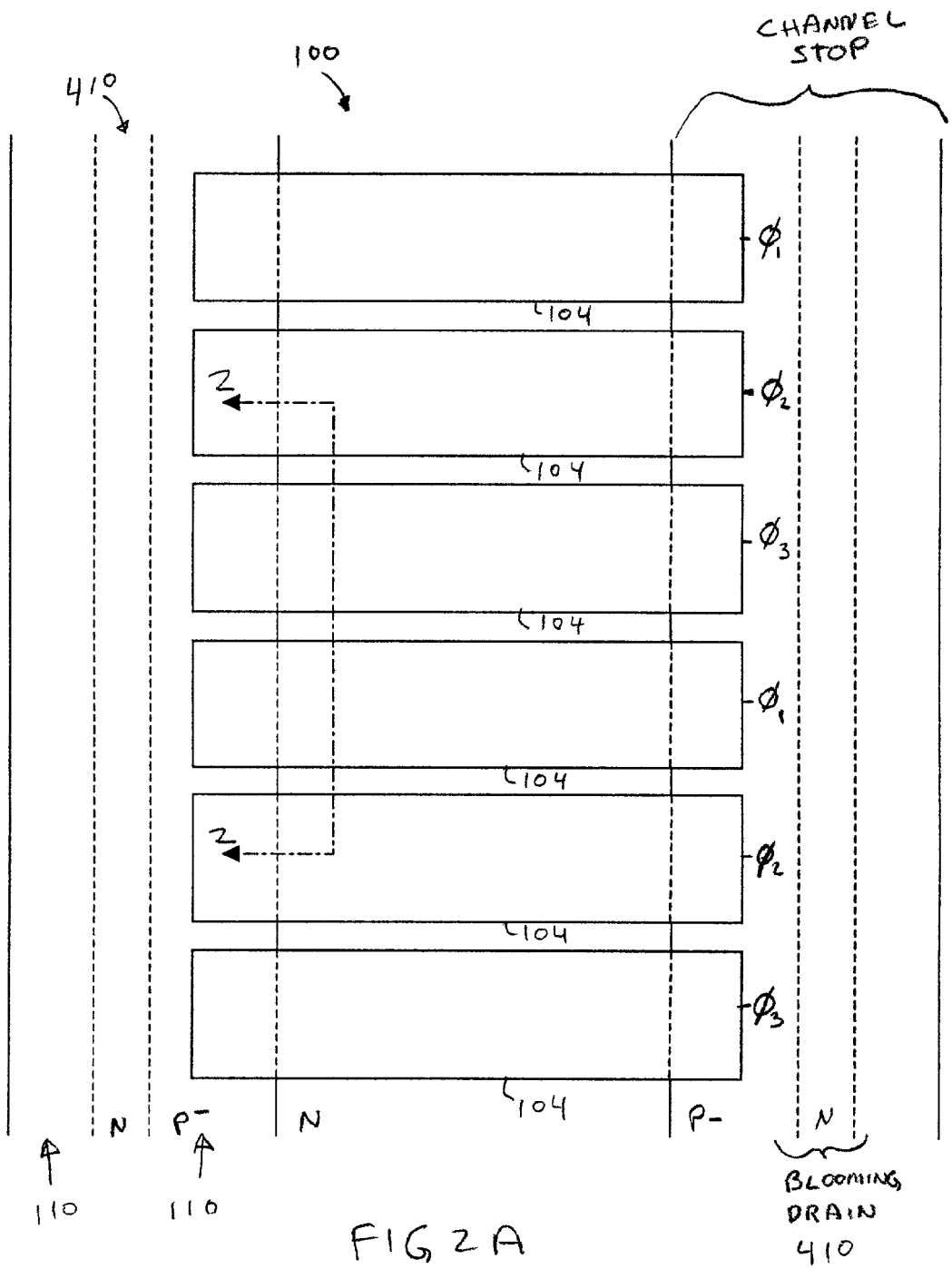
FIG. 2A is a top plan view of a physical layout of a portion of the CCD array according to the present invention illustrating multiple phase transfer capacitors formed on a CMOS substrate.

An exemplary embodiment of a portion of a CCD array formed using CMOS processing steps is shown in FIGS. 2A-4D. FIG. 2A is a top-plan view of a physical layout of the exemplary CCD shift register formed by standard CMOS processing in accordance with an exemplary embodiment of the invention. Although the CCD array is described in the context of an imager system, the techniques described below allow any type of CCD array to be implemented using standard CMOS process techniques. Thus, the CCD array shown in FIGS. 2A through 3B may be used, for example, as a delay line, a split gate filter or an analog frame store.

As known to those skilled in the art, CMOS circuits are fabricated on a semiconductor substrate, such as a silicon wafer substrate having a first N or P (negative or positive) conductivity type. Charge wells having a second, opposite P or N conductivity type are formed on the substrate. For the sake of simplicity, the present invention is described in terms of N-wells formed in a P-type substrate. It is contemplated, however, that the invention may also use P-wells formed in an N-type substrate.

As shown in FIG. 2A, the exemplary CCD array structure is a buried channel shift register that includes an N-well structure 100 formed in a P-type epitaxial silicon substrate. The N-well forms the transmission channel for the CCD array and, if the CCD array is an imager array, the light collection channel. In the exemplary embodiment, across the N-well 100 are formed polysilicon electrodes or "gates" 104 which are coupled to various phases Ø1, Ø2 and Ø3 of the three-phase clock signal. The three phase clock signal enables the shifting of charge along the N-well channel 100 as known to those skilled in the art.

Figure 2B:
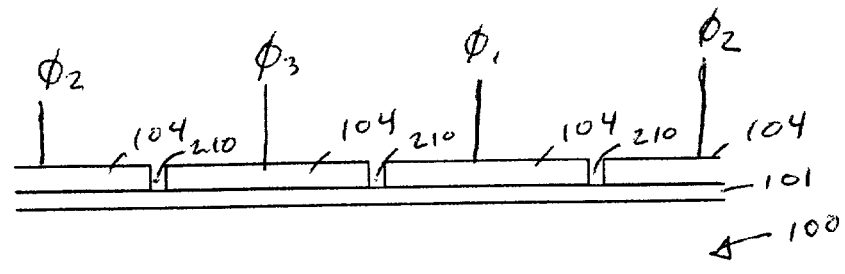
FIG. 2B is a cross-sectional view along lines 2-2 of the CCD array shown in FIG. 2A.

FIG. 2B shows a cut-away side plan view of the exemplary structure shown in FIG. 2A, along the lines 2-2, shown in FIG. 2A. A gate oxide 101 is formed over the N-well and polysilicon transfer gates 104 are deposited to define the CCD structure. In this way, with current and future design rules and fine line lithography, closely spaced MOS capacitors may be patterned with a single polysilicon process to form the CCD array. The transmission channel 100 is formed as a CMOS N-well, the oxide layer is a CMOS gate oxide and the electrodes are the first or only polysilicon layer of the CMOS process. Accordingly, the present invention forms the CCD array of FIG. 2 using a conventional CMOS foundry process. If the CCD array, shown in FIG. 2A is an imager array, it may also include anti-blooming drains 410 that are also formed as CMOS N-wells. Although the devices shown in FIGS. 2A and 2B are buried channel structures, it is contemplated that, if the inter-electrode gap is suitably stabilized, channel structures may also be implemented using standard CMOS processing steps. Exemplary channel structures are described below with reference to FIGS. 4A, 4C and 4D.

A standard CMOS IC fabrication process in accordance with an exemplary embodiment of the invention may, for example, employ both P-well regions and N-well regions formed in a lightly doped P-type substrate. A typical substrate may, for example, have a dopant concentration of approximately $10^{15}$ atoms/cm$^2$ while the N-well and P-well may have a dopant concentration of $10^{17}$ atoms/cm$^2$. In the exemplary embodiments described below, using standard CMOS IC fabrication processes, N-channel field effect transistors (FETs) may be formed in the P-wells and P-channel FETs may be formed in the N-wells. A P-channel FET may be formed in an N-well, for example, using P+ diffusions to form the source and drain regions of the FET or, in a P-type lightly doped drain (LDD) region. Exemplary dopant concentrations for the P+ diffusions may be, for example greater than $10^{18}$ atoms/cm$^2$ while an exemplary dopant concentration of the P-type LDD region may be $10^{17}$ atoms/cm$^2$. The gate oxide layer 101 may be grown or deposited on the channel between the source and drain and polysilicon or metal may be deposited to form gate electrodes of the CCD imaging array 12 in accordance with the present invention. Similar process steps and dopant concentrations may be used to form N-channel FETs in P-wells that are formed in N-type substrates.

Figure 4A:
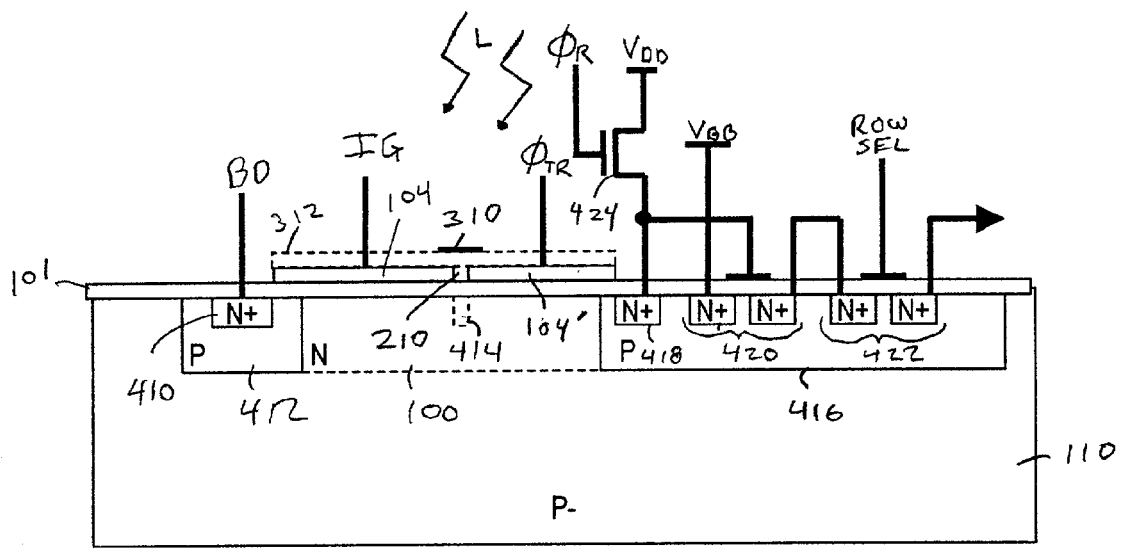
FIGS. 4A, 4B, 4C and 4D are side cross-sectional view of a physical layout structure of an exemplary pixel element of the pixel array of FIG. 1 in accordance with exemplary embodiments of the invention.
Figure 4B:
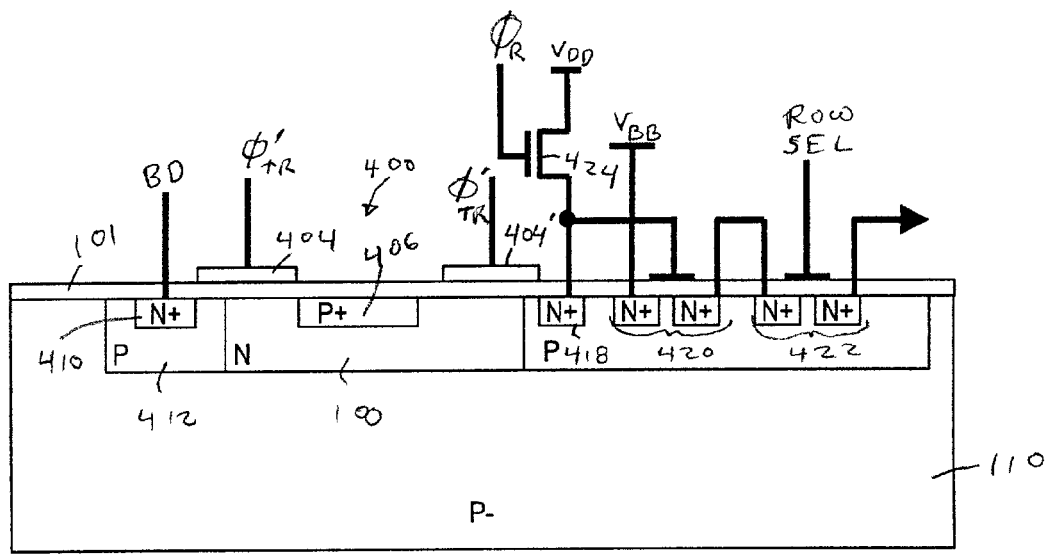
Figure 4C:
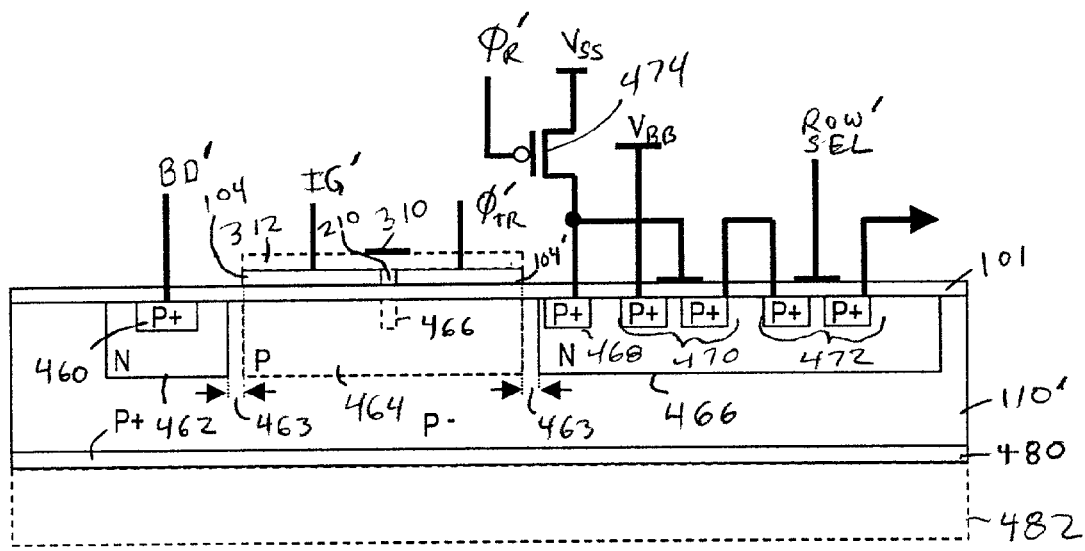
Figure 4D:
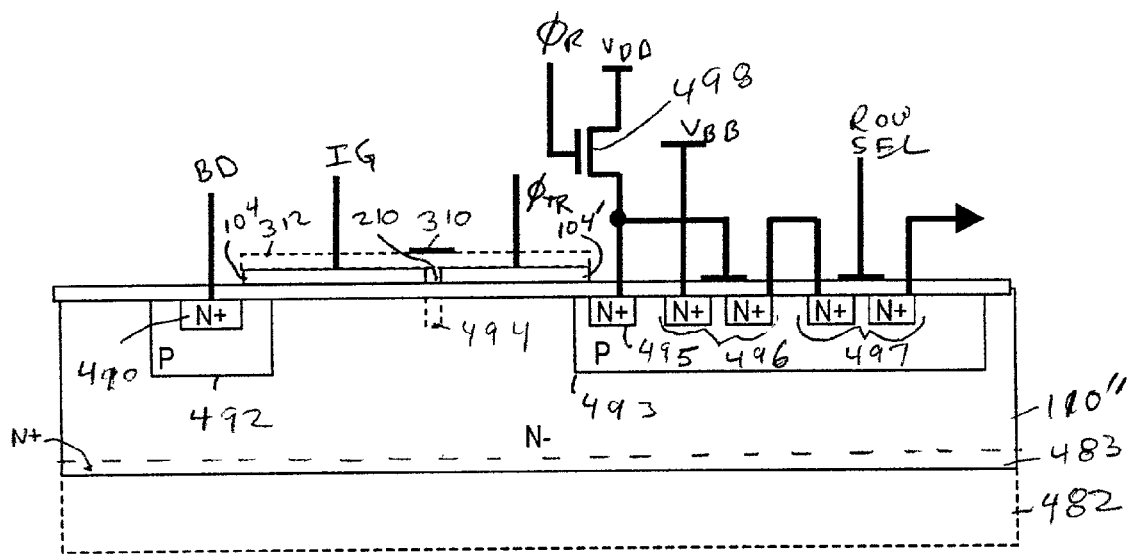

In the exemplary embodiment, the substrate may be subject to a metal deposition/etch step, thinned, implanted and annealed (see FIGS. 4C and 4D). The exemplary metal deposition/etch step uses refractory metals such as copper. While this may be outside of current standard CMOS foundry processing, it is contemplated that it may be adopted soon because of the signal propagation benefits of the refractory metals, especially copper.

The exemplary CCD array 12 may include circuitry which is capable of transferring charge in one direction, with at least a portion of the exemplary CCD functioning as a vertical transfer register (not shown). In this embodiment of the invention, each pixel may be implemented as a photogate device, coupled to the vertical CCD register by a source-follower amplifier (not shown) and a row-select transistor (not shown). The vertical CCD registers, which correspond to the columns of the imaging device, may be connected by a parallel connection to a serial CCD register, such as a serial address register or a CCD shift register (not shown) that provides the collected integrated charges to the ADC 18. The imager array may also be implemented with the serial CCD register as a horizontal register, where each CCD shift register cell is a separate pixel. In this embodiment of the invention, a single vertical CCD shift register may be employed to provide the integrated charge packets to the ADC 18.

In the exemplary embodiment of the invention described below with reference to FIGS. 4A through 4D, the imager array is implemented with each pixel being a single two- or three-phase CCD device, coupled to standard column-bus connections to provide accumulated charge one row at a time to the pixel detect circuitry 16, shown in FIG. 1. It is contemplated, however, that each pixel may include a multi-stage CCD shift register formed as described below. Such a CCD register may, for example, be used to implement a multi-frame delay or a temporal filter.

As shown in FIG. 2B, in the exemplary embodiment, gaps between the MOS capacitors are formed and established within the design rule resolution. When, for example, a gap size of approximately 0.3 microns is used, the polysilicon gates 104 form transfer gate structures that allow the device to operate as a high-performance CCD imager. The inventors have determined that the CCD electrodes formed by the processes of the exemplary embodiment described herein are functionally equivalent to overlapping electrodes formed by conventional CCD processes utilizing multi-polysilicon layer fabrication techniques that are not compatible with standard CMOS processes. Although the exemplary embodiment of the invention is shown as having a gap size of 0.3 microns or greater, it is contemplated that smaller gap sizes may be used. The gap size is limited by the minimum feature size allowed in the CMOS process. The inventors have determined that suitable structures may be formed using gap sizes between approximately 2 microns and the minimum feature size allowed in the CMOS process if the inter-electrode gaps are suitably stabilized and the device is operated within the breakdown voltage limitations.

FIG. 2B shows the N-well 100 formed in the P-type substrate 110 with the polysilicon electrodes 104 separated by inter-electrode gaps 210. The exemplary polysilicon electrodes 104 of CCD array 12 are separated from the N-wells by a gate oxide layer 101. Moreover, the polysilicon electrodes 104 are individually separated from each other by the inter-electrode gaps 210. In the exemplary embodiments, the gap is typically less that 0.65 microns. However, various sizes for the gaps between the polysilicon electrodes are contemplated as described below (See Table 3).

One method for stabilizing the inter-electrode gap is to apply a suitable bias voltage to the gate electrodes 104 and so generate fringing fields that extend into and stabilize the gaps. The bias level and, so the size of the fringing field varies in proportion to the size of the gap.

Another stabilizing method forms an implant, 414 shown in FIG. 4A, which is self-aligned to the inter-electrode gaps 210 between the photogate 104 region and the transfer gate. The implant 414 that may be, for example, an LDD implant or an optional threshold adjusting implant from the CMOS process, compensates for the potential charge barrier which may arise in the electrode gap region 210. Other materials for stabilizing the inter-electrode gap are described below with reference to FIGS. 7 and 8.

FIG. 3A is a top plan view of an alternative CCD shift register that employs a virtual gate structure. A single clock signal, Ø is used to transfer charge along the channel 100.

The exemplary embodiment of the invention shown in FIGS. 3A and 3B employs an N well to implement a buried channel 100. P+ diffusions 308 in the N-well form the virtual gate structures 300. Although the P+ diffusions 308 are shown as filling only part of the gap between the gate electrodes 104, it is contemplated that they may entirely fill the gap. In this instance, it may be desirable to use a two-phase clock signal to transfer charge through the CCD shift register. Virtual gate charge transfer devices are well known as described in U.S. Pat. No. 4,229,752 entitled VIRTUAL PHASE CHARGE TRANSFER DEVICE. The channel stop region 306 surrounding the channel 100 is also formed using a P+ diffusion. FIG. 3A also shows the optional N+ blooming drain 410 which may be implemented if the CCD register shown in FIGS. 3A and 3B is used as a CCD imager. If the optional blooming drain 410 is implemented, the P+ diffusion may not be used to form the channel stop region 306. Instead, the channel stop region 308 may be a P well or the P− substrate 110.

FIG. 3B is a cross sectional view of a portion of the CCD register shown in FIG. 3A, taken along lines 3-3. FIG. 3B shows the P+ diffusions 308 in the N-well channel 100 that form the virtual gates. It is noted that the structure shown in FIGS. 3A and 3B employs one-half of the gate electrodes of the CCD register structure shown in FIGS. 2A and 2B and only a single clock phase. The virtual gate 300 is formed by the P+ diffusion 308 into the N-well 100. Two transfer gates 304 on either side of the virtual gate are held at one potential while the charge is being held by the virtual gate and at another potential to transfer the charge to the next virtual gate. The PN junctions formed by the P+ diffusion 308 and the N-well 100 direct the accumulated charge along the channel toward the bottom of the page when the signal Ø is at its charge transfer value.

Single Pixel Operation

Referring now to FIG. 4A, a CCD type optical sensor is constructed from single level polysilicon process in accordance with an exemplary embodiment of the invention. As described above, the inter-electrode gap 210 may be stabilized by an optional N⁻ implant 414 between the photogate 104 and the transfer gate 104'. This implant is an improvement of a configuration described in IEEE JSSC, Vol. 34, No. 12, December, 1999, pp. 1835-1841. Alternatively, the inter-electrode gap 210 may be stabilized by forming a dielectric layer (e.g. a gate oxide layer) 312 over the gate electrodes 104 and 104' and forming a metal electrode 310 over the gap 210. The metal layer may be deposited during the CMOS metalization step. Alternately, if a double polysilicon CMOS process is used, the electrode 310 may be formed from polysilicon as a part of the second polysilicon deposition. Finally, the inter-electrode gap may be stabilized by applying suitable biases to the gate electrodes 104 and 104' to cause fringing fields from the gate electrodes to extend into the gap.

FIG. 4A illustrates an exemplary pixel of the CCD array 12. In operation, a light signal L (representing photons) impinges upon polysilicon electrode 104 adjacent to a transfer electrode 104'. The photoelectrons generated by the photons collect in a channel beneath the photogate electrode 104. During the integration period, the potential on the transfer electrode 104' is kept at a value to hold the accumulated photoelectrons in the channel beneath the photogate 104. The channel may be buried channel structure, implemented using an optional N-well 100 (designated by the dashed line in FIG. 4A underlying the polysilicon electrodes 104 and 104'). Alternatively, the N-well 100 may be eliminated and the CCD pixel operated as a surface-channel device.

A blooming drain is formed in the substrate by an N+ diffusion 410, inside of a P doped well 412 to provide anti-blooming control. Blooming is a phenomenon known in the art in which excess charge beyond pixel saturation spills over into adjacent pixels, causing blurring and related image artifacts in the signal OUT. In the exemplary embodiment of the invention, the blooming drain 410 collects the excess photoelectrons preventing them from interfering with other pixels. In the pixel structure of the present invention accumulated charge does not spill into the blooming drain 410 until it exceeds the potential established by the P barrier well 412. Because there are more majority carriers in the P barrier wells than in the P− substrate, accumulated charge beneath the integrating gate does not spill into the blooming drain 410 until a relatively large amount of charge has accumulated.

The P well 412 also diverts nearly all visible light photoelectrons that it receives into the charge collection imaging gate (IG) region. A P well 416 is also employed at the output end of the pixel to divert visible light photoelectrons into the image gate region (IG). As can be appreciated, these structures also divert electrons encountered in electron bombarded applications.

In a typical CCD image sensor, the charge capacity control voltage is constant throughout the integration period (i.e., charge fill period), so that a given charge capacity exists for each pixel in the imager array throughout the integration period. Methods are known in the art for increasing the dynamic range of an imager while maintaining a predetermined fixed charge capacity. One of these methods is extended dynamic range (XDR) processing which uses additional CMOS circuitry, outside or the imager array, to generate multiple reset levels and to process the resulting pixel signals. With XDR, the charge capacity control voltage is varied during the integration period, so as to increase the optical dynamic range of the CCD imager. XDR allows at least some contrast to be measured for higher light levels that otherwise would have saturated the linear range of pixel Px. An exemplary XDR system suitable for use with the present invention is described in U.S. Pat. No. 3,953,733 to Levine entitled METHOD OF OPERATING IMAGERS.

In operation, photogenerated electrons resulting from the photons L, impinging on the semiconductor material, are integrated under the photogate electrode 104, responsive to a charge capacity voltage, IG. The pixel structure receives a transfer signal $\varnothing_{TR}$ or "transfer phase" to transfer the contents of the N-well channel 100 portion of pixel Px to a readout circuit. In the exemplary embodiment of the invention, the transfer phase, $\varnothing_{TR}$, is held constant and the potential IG on the photogate 104 is varied to collect photo electrons at one level and to transfer the photoelectrons through the transfer gate to the output circuitry at another level. The relative values and timing of the signals IG, $\varnothing_{TR}$ and the reset phase $\varnothing_R$ are described below with reference to FIGS. 5 and 6. In the exemplary embodiment of the invention, the reset and readout circuitry is formed by N+ diffusions in the P well 416.

FIG. 4B is a cross-sectional view of an alternate CCD pixel that may be formed using standard CMOS processing steps. The pixel structure shown in FIG. 4B uses a virtual gate structure 400 that has only a single clock phase, Ø. The virtual gate 400 is formed by a P+ diffusion 406 into the N-well 100. Two transfer gates 404 and 404' on either side of the virtual gate are held at one potential while the charge is integrating and at another potential to transfer the charge from the virtual gate to the output circuitry. The PN junction formed by the P+ diffusion 406 and the N-well 100 direct the accumulated charge toward the charge sink 418 when the signal Ø is at its charge transfer value. The virtual gate has advantages as a photodetector over the photogate shown in FIG. 4A because there is no polysilicon overlying the virtual gate. Thus, the image sensor may be more sensitive to light having shorter wavelengths, such as ultraviolet light. Although the virtual gate structure is shown as a photogate, it is contemplated that it may be used as a charge transfer gate in a CCD register as shown in FIGS. 2A through 3B.

FIGS. 4C and 4D are cross sectional views of alternative CCD pixel structures that may be used with a back-illuminated imager. The structure shown in FIG. 4C is a P-channel device while the structure shown in FIG. 4D is an N-channel device. The P channel in the structure shown in FIG. 4C may be formed as an enhancement layer in the P− substrate 110' or beneath the P well 464. The basic feature of the two embodiments shown in FIGS. 4C and 4D is the N wells formed in the P− substrate in FIG. 4C and the P wells formed in the N− substrate in FIG. 4D. These PN junctions form barriers for photoelectrons (or photoholes for P channel devices) generated in the substrate material, causing the photoelectrons or photoholes to migrate to the integrating wells. Although the examples show CCD structures used for the imaging elements, the same structure would work for other types of photodetectors such as conventional CMOS photodiodes. Thus, the inventive feature of using PN junctions to divert photoelectrons or photoholes into a photodetector is independent of the type of photodetector that is used.

In the embodiment of the invention shown in FIG. 4C, the polysilicon gates 104 and 104' are configured to provide barrier gaps 463 between the P well 464 and the N-well barrier diffusion 462. The barrier gaps 463 separate the P-channel from the blooming drain formed by the N-well 462 and P+ diffusion 460. In addition, the N-well 462 prevents photoholes generated by illuminating the back side of the imager from entering the blooming drain. Instead, these holes are directed toward the P-channel formed in the P− substrate or in the P-well 464. The N-well in which the charge sink 468, source follower transistor 470, row-select transistor 472 and reset transistor 474 are formed also diverts the photoholes into the integrating wells. Thus, substantially all of the photoholes generated by light impinging on the back side of the imager are converted into image information.

The device shown in FIG. 4C is fabricated by forming the N-wells 462 and 466 in the P− substrate 110', forming the optional P-well 464 in the substrate and then forming the P+ diffusions 460 and 468 as well as the source and drain P+ diffusions for the transistors 470, 472 and 474. Next, the gate oxide layer 101 is deposited and the polysilicon electrodes 104 and 104' are formed on top of the gate oxide layer. If the gap-stabilizing implant 466 is used, it is implanted as a self-aligned P– implant through the gap between the electrodes 104 and 104'. This implant may be, for example, an optional threshold adjusting implant in the CMOS process. If the gap is stabilized using the electrode 310, then the next step is to form the oxide layer 312 over the polysilicon gate electrodes 104 and 104'. The step of depositing the metal electrode 310 also forms the metal connections to the blooming drain 460, to the charge sink 468 and to the transistors 470, 472 and 474. In the exemplary embodiment of the invention, these metal gates and connections are formed from a refractory metal such as copper. After this structure is formed, the wafer is thinned by removing the section 482 of the P– substrate 110' and implanting a P+ layer 480 in the thinned wafer. After the thinning and implanting operation, the structure shown in FIG. 4C is annealed at high temperature, for example, 900 degrees Celsius. This high-temperature annealing is possible because the device uses refractory metal for the metalization step.

FIG. 4D illustrates another type of pixel cell that may be used with a back-illuminated imager. This pixel cell is analogous to the cell shown in FIG. 4A except that the P– substrate is replaced by an N– substrate. The exemplary device shown in FIG. 4D uses a surface N channel that is formed beneath the gate electrodes 104 and 104' as an enhancement layer in the N-substrate 110'. The device operates in the same way as the pixel cell described above with reference to FIG. 4A except that photoelectrons are blocked from entering the P wells 492 and 493 due to the PN junction formed between the N– substrate and the P wells.

The device shown in FIG. 4D is fabricated by forming the P wells 492 and 493 in the N– substrate 110'' and then forming the N+ diffusions 490 and 495 as well as the source and drain N+ diffusions for the transistors 496, 497 and 498. Next, the gate oxide layer 101 is deposited and the polysilicon electrodes 104 and 104' are formed on top of the gate oxide layer. If the gap-stabilizing implant 494 is used, it is implanted as a self-aligned N– implant through the gap between the electrodes 104 and 104'. This implant may be, for example, an optional threshold adjusting implant in the CMOS process. If the gap is stabilized using the electrode 310, then the next step is to form the oxide layer 312 over the polysilicon gate electrodes 104 and 104'. The step of depositing the metal electrode 310 also forms the metal connections to the blooming drain 490, to the charge sink 495 and to the transistors 496, 497 and 498. In the exemplary embodiment of the invention, these metal gates and connections are formed from a refractory metal such as copper. After this structure is formed, the wafer is thinned by removing the section 482 of the N– substrate 110''. After the thinning operation, the structure shown in FIG. 4D is annealed at high temperature, for example, 900 degrees Celsius. As shown in FIG. 4D, the exemplary image may include an optional N+ diffusion 483 which is formed after the wafer is thinned but before it is annealed.

Figure 5:
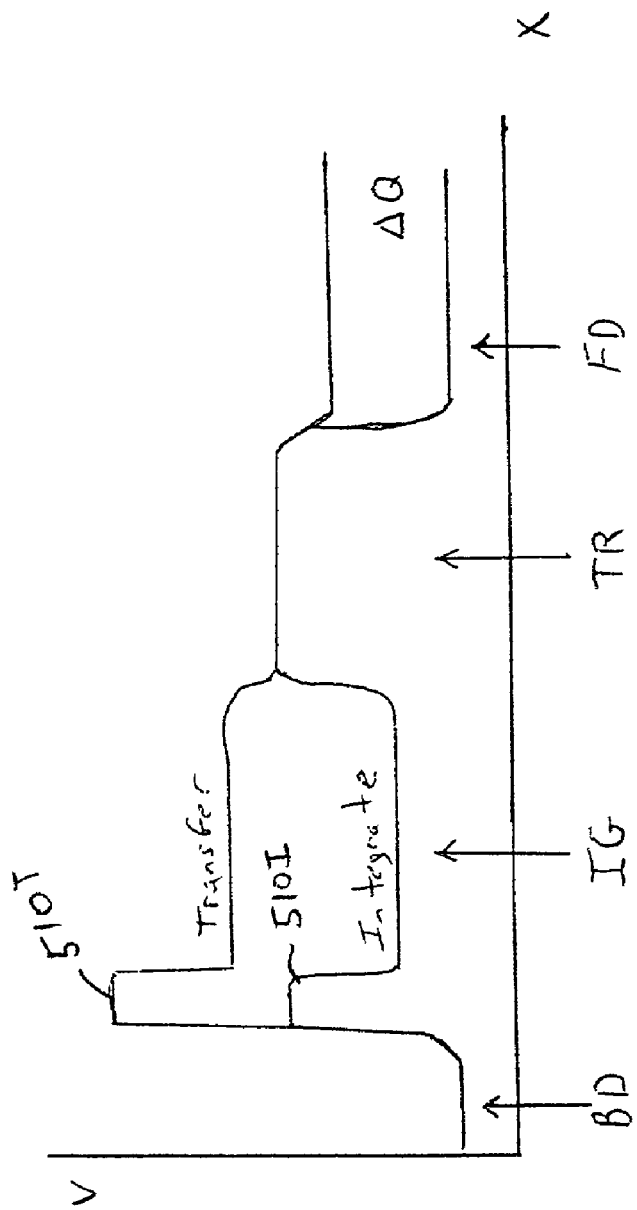
FIG. 5 is a signal graph, showing exemplary signals that may be applied to the pixel of FIG. 4, for reading a charge from the pixel.

FIG. 5 shows a graph of charge level versus distance along the pixel, as shown in FIG. 4A, that illustrates the relationship among the signals BD, IG, $\varnothing_{TR}$, $\varnothing_R$ and FD. The charge level BD illustrates the level of the blooming drain 410. The peaks 510I and 510T represent the potential barrier formed by the P barrier well 412 when the potential IG is at the integrating level and at the transfer level, respectively. The potential IG is shown at two levels, the lower level is used when charge is integrated beneath the photogate and the upper level is used to transfer charge from beneath the photogate to beneath the transfer gate. The potential TR represents the potential on the transfer gate and the potential FD represents the potential on the charge sink 418. The potential TR, corresponding to the signal $\varnothing_{TR}$, remains constant at a level between the integrating potential and transfer potential of the signal IG. The signal FD is shown as having two levels. The lower level represents the reset level and the upper level represents a level after an exemplary charge transfer from the transfer gate.

The pixel shown in FIG. 4A also includes three transistors, formed in the P barrier well 416. These transistors include a reset transistor 424, an emitter follower amplifier transistor 420 and a row-select transistor 422. The operation of the circuit shown in FIG. 4 is illustrated with reference to the signal timing diagram of FIG. 6. At time T1, the charge beneath the transfer gate is reset responsive to the reset phase OR of the clock signal. This signal turns on transistor 424, applying $V_{DD}$ to the charge sink 418. This forward-biases the junction, causing any charge to be conducted away from the transfer gate and the sink 418. Next, a pulse signal IG is applied to the photogate 104 at time T2 for XDR sensors and at time T3 for linear sensors. This pulse signal establishes a charge level on the photogate which, in turn, creates a potential well beneath the photogate 104. Between times T2 and T6 for XDR sensors or between times T3 and T4 for linear sensors, charge accumulates beneath the photogate 104. After time T4 for the linear sensor and after time T6 for the XDR sensor, the sensed signal may be read from the charge sink 418 by the source-follower transistor 420 and the row-select transistor 422. At time T7, the pixel is reset by applying the clock phase $\varnothing_R$ to the gate electrode of transistor 424.

Extended dynamic range (XDR) operation is achieved by sequentially applying two or more potentials as the signal IG to the photogate 104 during a single integration interval. As shown in FIG. 5, a first pulse is applied to the photogate at time T2 and a second pulse is applied at time T5. If the charge accumulated by the pixel at time T5 is at the level of spilling into the diffusion 410 (i.e. if the pixel is saturated), the additional pulse increases the depth of the charge well, allowing additional charge to accumulate beneath the photogate 104. This additional charge is transferred to the transfer gate after time T6. If the sensor is operated as a linear sensor, however, only a single pulse is applied as the signal IG at time T3. In response to this signal, the photogate 104 accumulates charge between times T3 and T4 and transfers the charge accumulated at time T4 to the charge sink 418.

Electrode-Gap Stabilization

Figure 7:
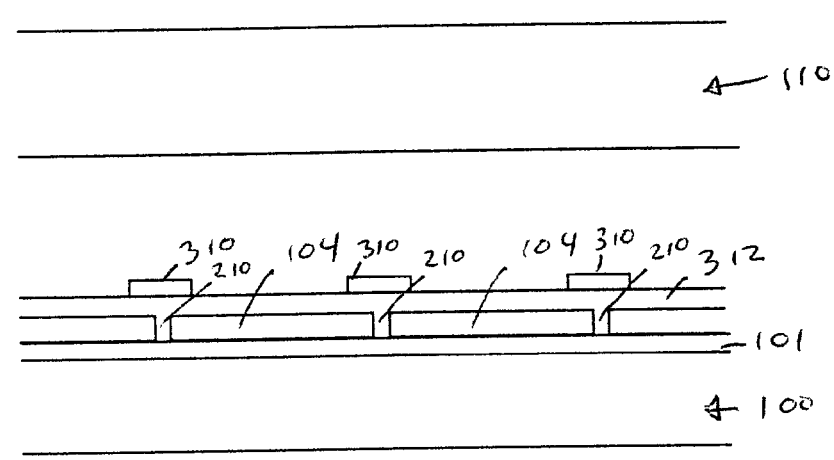
FIG. 7 is a cross-sectional view of a physical layout structure such as that shown in FIGS. 2A and 2B, after metalization in accordance with an exemplary embodiment of the invention.
Figure 8:
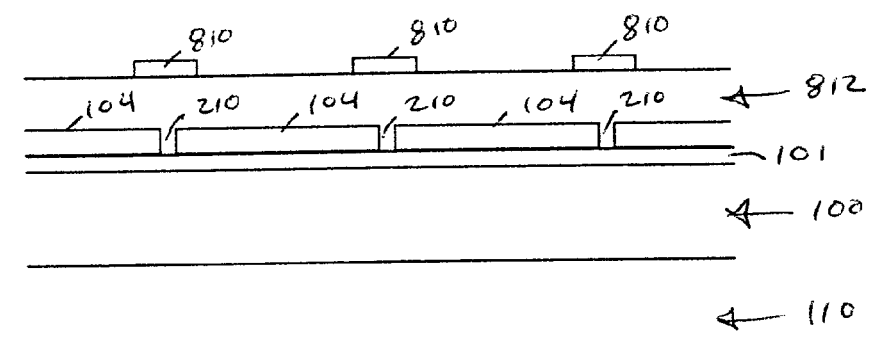
FIG. 8 is a cross-sectional view of a physical layout structure such as that shown in FIGS. 2A and 2B, in accordance with an exemplary embodiment of the invention.

As described above, with reference to FIGS. 2A through 4D, the present invention uses closely-spaced polysilicon electrodes 104 to implement a CCD structure using standard CMOS processing techniques. As shown in FIG. 4A, the inter-electrode gap may be stabilized by fringing fields extending into the gap from suitably biased gate electrodes or by a self-aligned N– diffusion 414. It may be desirable to use other methods stabilize the inter-electrode gaps 210, thus preventing charge barriers from developing in the gaps and interfering with charge transfer between adjacent electrodes. FIGS. 7 and 8 show cross-sectional views of a substrate employing electrode gap stabilization in accordance with exemplary embodiments of the present invention. FIG. 7 is a cut-away side view of an imager constructed according to an exemplary embodiment of the subject invention, which includes a metal layer 310 formed on a dielectric layer 312 that covers the electrodes 104 and the inter-electrode gaps 210. The metal layer may cover an area just beyond the gap or may cover a larger surface having a range to where the metal electrodes are separated by a distance corresponding to a minimum design feature of the CMOS process. In the embodiment of the invention shown in FIG. 7, the dielectric layer 312 is a gate-oxide layer and, so, is relatively thin. This thin layer may reduce yield in the device if a hole in the oxide layer allows contact between the metal electrodes 310 and one of the polysilicon electrodes 104.

Alternatively, as shown in FIG. 8, a metal electrode 810 may be used with a thicker deposited dielectric 812. Thus, overlapping metal may be used to stabilize the gaps between the single polysilicon electrodes. By providing a metal strip over the gaps in the single level polysilicon, a more stable structure is formed with reduced charging effects. This creates a structure similar to CCD polysilicon overlap while maintaining the low cost fabrication of the standard CMOS process.

The metal electrodes shown in FIGS. 4A through 4D and in FIGS. 7 and 8 may be biased at a constant potential or they may be clocked with the same clock signal as used for the transfer electrodes. The potential of this clock signal, however is adjusted to form an appropriate potential in the inter-electrode gap during charge transfer.

Although not illustrated, it is contemplated that an implant, such as shown in FIGS. 4A through 4D may be used together with the overlapping metal shown in FIGS. 7 and 8. In addition, it is contemplated that polysilicon may be used in place of the metal electrodes 310 and 810 shown in FIGS. 7 and 8. If polysilicon is used for the electrodes 319 and 810, the standard CMOS process may be a double-polysilicon process.

Tables 1, 2 and 3 show exemplary implementation details for forming a CCD array 12 and the pixel structures shown in FIGS. 4A through 4D in accordance with the exemplary embodiment, using a standard CMOS foundry process. Table 1 assigns labels to standard CMOS process steps. Table 2 provides parameters used for the implementation of channel stop structures (FIGS. 2A and 2B) for various types of CCD devices in terms of the labels defined in Table 1. Table 3 provides parameters for the implementation of polysilicon electrodes, inter-electrode gaps and describes stabilizing structures for the gaps. The parameters defined by these tables are best understood when read in conjunction with the description of FIGS. 2A-8.

TABLE 1

Process Step Labels:

| Common Names | Label |
| --- | --- |
| N-Well | NW |
| P-Well | PW |
| Thin Oxide | OD |
| Thick Oxide | OD2 |

TABLE 2

Channel Stop Structures in the Array

| CCD Type | Channel (um) | Channel Stop (um) |
| --- | --- | --- |
| Buried n-chan. 7.5 um × 7.5 um | NW Widths: 1.0, 1.7, 2.0, 3.0, 4.5, 5.25, 6.0, 6.5 | NW//Space: 6.5 um-1.0 um Min Rule: 1.0 um |
| Buried n-chan. | NW Widths: | NW//Space: 6.5 um-1.0 um |

TABLE 2-continued

Channel Stop Structures in the Array

| CCD Type | Channel (um) | Channel Stop (um) |
| --- | --- | --- |
| 7.5 um × 7.5 um | 1.0, 1.7, 2.0, 3.0, 4.5, 5.25, 6.0, 6.5 OD within NW | OD Space: NW_Space + 1.0 um |
| Buried n-chan. 7.5 um × 7.5 um | NW Widths: 1.0, 1.7, 2.0, 3.0, 4.5, 5.25, 6.0, 6.5 OD extend NW | NW//Space: 6.5 um-1.0 um OD Space: NW_Space − 1.0 um (0.6 um MIN) |
| Surface n-chan. 7.5 um × 7.5 um | OD OD2 | Gap in OD |
| Surface p-chan. 7.5 um × 7.5 um | OD OD2 | Gap in OD2 |
| Bucket Brigade 7.5 um × 7.5 um | N+ & OD2 N+ & OD in NW | Gap in OD and PW |

TABLE 3

Gate Structures

| CCD Type | Gate | Comments |
| --- | --- | --- |
| Three Phase | Single Poly with gaps | Space: [0.35 um-0.65 um] |
| Three Phase | Single Poly with gaps covered by M1 | Poly Space: [0.5 um] M1-Poly overlap: 0.1 um Min M1 Space: 0.45 um |
| Three Phase | M1 line with gaps | Space: 0.45 um |
| Two Phase (Parallel Odd/Even) | Poly-M1: M1 acts as barrier | Poly Space: [0.5 um] M1-Poly overlap: 0.1 um Min M1 Space: 0.45 um |

Referring once again to Tables 1-3, different configurations can be used to form CCD arrays by using CMOS fabrication processes. In Table 2, it can be seen that the CCD can be formed in a buried N-channel, a surface N-channel, a surface P-channel or a bucket brigade configuration. Multi-phase CCD arrays are possible by selecting a configuration for the gate structure as depicted in Table 3. By the use of metal layers such as are described above with reference to FIGS. 7 and 8, it is also possible to provide separate gating. Therefore, if a CCD sensor array 12 is configured for three phases by the use of polysilicon, the metal deposition that is used for gate extension provides asymmetry in the gates that allows for two-phase operation. The bias of the metal gate creates a barrier between a region under the gate and the polysilicon regions adjacent the region under a gate. When the metal and polysilicon gates are clocked together, only two phases are needed to transfer charge along the CCD array. In this mode, charge is transferred in a direction where there is no barrier, and therefore the charge is transferred in a direction opposite the direction of the barrier.

Table 2 describes the parameters for forming channel stop structures in the array. In the prior art, when constructing a CCD array, additional non-CMOS processes are used. Examples of non-CMOS processes include the use of different implant dosages or the use of different diffusion steps. The separation of channels improves charge transfer efficiency.

The gate structures may be constructed according to the parameters set forth in Table 3. The circuit has the ability to achieve consecutive transfer of signals corresponding to pixels. The table describes individual pixel unit structures repeated multiple times in order to form the CCD array 12.

The use of copper metal line processing with refractory metal via may be used in advanced foundry processes. The devices can be fully fabricated including all metal connections with this standard low-cost process without interruption for thinning steps. With this standard low cost process, post fabrication thinning backside treatment and furnace anneal can then be performed after pre-screening the wafers or die for operational compliance. With earlier processes using aluminum for metal interconnects, care is needed to maintain process steps below the eutectic temperature of aluminum of 577 C (at 88.7% silicon alloy concentration) to avoid junction spiking. Also, the solubility of silicon into aluminum is significant above 500 C. To reduce this diffusion, barrier metal layers such as TiN are used but these metals introduce added contact resistance and add complexity to the device fabrication. In the exemplary embodiment, a process employs high temperature refractory metals such as copper or tungsten. This is a simpler process that increases yield and lower device costs. These metals are also stable when exposed to annealing temperatures over a longer exposure time. With these advanced processes, the imagers can be completely fabricated and will operate as imaging devices and fully tested electrically prior to any thinning steps. This further reduces the costs of thinning every wafer without operational compliance.

CCD circuit designs may also be fabricated with standard low cost CMOS process on wafers prepared as a thin epitaxial layer grown onto an optically transmissive substrate such as sapphire or quartz. These imagers would then operate as backside-illuminated devices without the need for thinning, treatment, and annealing steps. By carefully growing the epitaxial layer from a seed crystal region on top of an optically transparent carrier substrate, a thin crystal silicon base can be used to fabricate CMOS imaging devices with high performance and low cost. These imagers can be designed to operate with backside illumination through the optically transparent substrate. Regions of the imager can be electrically isolated by etching an outline around each region to remove the crystal silicon. The insulating substrate will support the structure mechanically.

It will be understood that various changes in the details, materials, and arrangements of the parts which have been described and illustrated above in order to explain the nature of this invention may be made by those skilled in the art without departing from the principle and scope of the invention as recited in the following claims.

What is claimed:

1. A charge coupled device made according to a standard CMOS process on a substrate of a first conductivity type, the charge coupled device comprising:
    a dielectric layer overlaying at least a portion of the substrate, the dielectric layer being a CMOS gate dielectric layer;
    at least two gate electrodes overlaying the dielectric layer, the at least two gate electrodes configured to define at least two charge wells in the substrate of the first conductivity type, said charge wells being formed in response to a bias potential applied to the at least two gate electrodes, the at least two gate electrodes being separated by an inter-electrode gap between the at least two gate electrodes; and
    a semiconductor region of the first conductivity type, formed in the interelectrode gap, but having a different dopant concentration than the substrate for stabilizing the inter-electrode gap.

2. A charge coupled device according to claim 1, wherein the apparatus for stabilizing the inter-electrode gap further includes:
    a further dielectric layer formed over the at least two gate electrodes; and
    a further gate electrode formed overlying the further dielectric layer and selectively positioned over the inter-electrode gap.

3. A charge coupled device according to claim 1, wherein a first one of the charge well areas and its corresponding gate electrode form a photogate optical sensor and the charge coupled device further comprises:
    a charge barrier well of a first conductivity type adjacent to the photogate optical sensor, the charge barrier well being configured to divert photocarriers into at least the photogate optical sensor; and
    a diffusion region of a second conductivity type, different from the first conductivity type, the diffusion region being formed inside the charge barrier well and being configured as an anti-blooming drain.

4. A charge coupled device according to claim 3, further including:
    a further charge barrier well of the first conductivity type, distal to the photogate optical sensor and the anti-blooming drain; and
    a second diffusion region of the second conductivity type in the further charge barrier well, the second diffusion region forming a charge sink, wherein one of the at least two gate electrodes that is not a photogate optical sensor overlies a portion of the further charge barrier well adjacent to the charge sink.

5. A charge coupled device according to claim 4, further comprising a plurality of further diffusion regions of the second conductivity type in the further charge barrier well adjacent to the charge sink and forming a plurality of transistors, wherein the plurality of transistors includes a reset transistor and an emitter follower amplifier, both coupled to the charge sink.

6. The charge coupled device of claim 1, wherein the at least two gate electrodes include at least two CMOS polysilicon gate electrodes.

7. An optical sensor circuit for receiving photocarriers from a source and being formed on a single monolithic substrate comprising:
    a charge coupled device (CCD) array, the array being formed of a plurality of single polysilicon CMOS pixels, each pixel including,
    a semiconductor layer of a first conductivity type formed on the substrate;
    a first dielectric layer overlaying the semiconductor layer, the first dielectric layer being a CMOS gate dielectric layer;
    at least two gate electrodes overlaying the first dielectric layer and configured to define at least two charge wells, respectively, in the semiconductor layer, in response to a bias potential applied to the at least two gate electrodes, wherein adjacent ones of the at least two gate electrodes are separated by an inter-electrode gap in the semiconductor layer, a combination of one of the at least two charge wells and its respective overlaying gate electrode forming a photogate optical sensor and a combination of another one of the at least two charge wells and its respective overlaying gate electrode forming a transfer gate; and
    a semiconductor region of the first conductivity type, formed in the inter-electrode gap for stabilizing the inter-electrode gap, but having a different dopant concentration than the semiconductor layer.

8. An optical sensor according to claim 7, further comprising:
a charge barrier well of the first conductivity type adjacent to the photogate optical sensor, the charge barrier well being configured to divert photocarriers into at least the photogate; and
a diffusion region of a second conductivity type, different from the first conductivity type, the diffusion region being formed inside the charge barrier well and being configured as an anti-blooming drain.

9. An optical sensor according to claim 8, further including:
a further charge barrier well of the first conductivity type, distal to the photogate optical sensor and the anti-blooming drain; and
a second diffusion region of the second conductivity type in the further charge barrier well, the second diffusion region forming a charge sink, wherein one of the at least two gate electrodes that is not a photogate optical sensor overlies a portion of the further charge barrier well adjacent to the charge sink.

10. A charge coupled device according to claim 8, further comprising a plurality of further diffusion regions of the second conductivity type in the further charge barrier well adjacent to the charge sink and forming a plurality of transistors, wherein the plurality of transistors includes a reset transistor and an emitter follower amplifier, both coupled to the charge sink.

11. The charge coupled device of claim 7, wherein the semiconductor layer is a transmission channel and the transmission channel is a CMOS N-well.

12. A charge coupled device made according to a standard single polysilicon CMOS process, the charge coupled device comprising:
a substrate of a first conductivity type;
a well region of a second conductivity type, opposite to the first conductivity type;
an oxide layer formed over at least the well region, the oxide layer being a CMOS gate oxide layer;
first and second polysilicon gate electrodes formed on the oxide layer over the well region, the first and second gate electrodes being separated by an inter-electrode gap in the well region, wherein the combination of the first and second polysilicon gate electrodes, the oxide layer and the well region form a buried channel CCD register; and
a semiconductor region of the second conductivity type, formed in the inter-electrode gap of the well region for stabilizing the inter-electrode gap, but having a different dopant concentration than the well region.

13. The charge coupled device according to claim 12, further comprising optics that are configured to focus radiation onto the back side of the substrate.

14. A charge coupled device according to claim 12, further comprising:
a charge barrier well of a first conductivity type adjacent the first polysilicon gate electrode and distal to the second gate electrode; and
a diffusion region of a second conductivity type, different from the first conductivity type, the diffusion region being formed inside the charge barrier well and being configured as an anti-blooming drain.

15. A charge coupled device according to claim 14, further including:
a further charge barrier well of the first conductivity type adjacent to the second polysilicon gate electrode and distal to the first polysilicon gate electrode and the anti-blooming drain; and
a second diffusion region of the second conductivity type in the further charge barrier well, the second diffusion region forming a charge sink, wherein the second gate electrode overlies a portion of the further charge barrier well adjacent to the charge sink.

16. A charge coupled device according to claim 15, further comprising a plurality of further diffusion regions of the second conductivity type in the further charge barrier well adjacent to the charge sink and forming a plurality of transistors, wherein the plurality of transistors includes a reset transistor and an emitter follower amplifier, both coupled to the charge sink.

17. A back illuminated imager comprising:
a substrate of a first conductivity type having a front side and a back side;
a CCD pixel structure formed in the front side of the substrate;
a well region of a second conductivity type, opposite to the first conductivity type, formed in the front side of the substrate and separate from the CCD pixel structure, the well region and the substrate forming a semiconductor junction; and
at least one diffusion region in the well region of the second conductivity type forming a component of a back illuminated imager, said CCD pixel structure overlying said at least one diffusion region;
whereby the component of the back illuminated imager is shielded from photocarriers generated in response to photons received at the back side of the substrate by the semiconductor junction.

* * * * *